United States Patent
Buckwalter et al.

(10) Patent No.: US 7,961,778 B2
(45) Date of Patent: Jun. 14, 2011

(54) DATA-DEPENDENT JITTER PRE-EMPHASIS FOR HIGH-SPEED SERIAL LINK TRANSMITTERS

(75) Inventors: James F. Buckwalter, Pasadena, CA (US); Daniel J. Friedman, Sleepy Hollow, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/177,231

(22) Filed: Jul. 22, 2008

(65) Prior Publication Data

US 2008/0298530 A1 Dec. 4, 2008

Related U.S. Application Data

(63) Continuation of application No. 11/345,109, filed on Jan. 31, 2006, now abandoned.

(51) Int. Cl.
*H04B 17/00* (2006.01)
*H04Q 1/20* (2006.01)

(52) U.S. Cl. ......... 375/226; 375/296; 375/358; 375/346

(58) Field of Classification Search .................. 375/233, 375/341, 232, 229, 296, 258
See application file for complete search history.

(56) References Cited

U.S. PATENT DOCUMENTS

| | | | |
|---|---|---|---|
| 4,689,804 A | | 8/1987 | Srinivasagopalan et al. |
| 5,301,196 A * | | 4/1994 | Ewen et al. .................. 370/518 |
| 6,266,379 B1 * | | 7/2001 | Dally ............................ 375/296 |
| 6,580,770 B2 | | 6/2003 | Imanaka et al. |
| 6,707,857 B1 * | | 3/2004 | Cairns .......................... 375/296 |
| 2001/0016014 A1 | | 8/2001 | Nam |
| 2001/0043649 A1 | | 11/2001 | Farajad-Rad |
| 2002/0027963 A1 | | 3/2002 | Imanaka et al. |
| 2003/0212843 A1 * | | 11/2003 | Molgaard et al. ............. 710/100 |
| 2004/0037372 A1 | | 2/2004 | Kuki et al. |
| 2004/0100588 A1 | | 5/2004 | Hartson et al. |
| 2005/0134306 A1 * | | 6/2005 | Stojanovic et al. ............. 326/31 |
| 2006/0029160 A1 * | | 2/2006 | Kim et al. ...................... 375/326 |
| 2006/0093075 A1 * | | 5/2006 | Radich .......................... 375/341 |
| 2006/0140224 A1 * | | 6/2006 | Yoshida et al. ............... 370/535 |
| 2006/0220674 A1 * | | 10/2006 | Yeung et al. .................... 326/29 |
| 2006/0280272 A1 * | | 12/2006 | Stojanovic .................... 375/355 |

OTHER PUBLICATIONS

Buckwalter, et al., A 10 GB/s Data-Dependent Jitter Equalizer, IEEE 2004 Custom Integrated Circuits Conference, 2004, 39-42, California Institute of Technology, Pasadena, CA, USA.

* cited by examiner

*Primary Examiner* — Chieh M Fan
*Assistant Examiner* — Qutbuddin Ghulamali
(74) *Attorney, Agent, or Firm* — Ference & Associates LLC

(57) ABSTRACT

In the context of high-speed serial links, data-dependent jitter compensation techniques performed using phase pre-distortion. Broadly contemplated is an expansion of the notion of pre-emphasis beyond conventional amplitude compensation of ISI, whereby phase pre-emphasis for compensating data-dependent jitter (DDJ) is introduced. DDJ can be addressed by exploiting the relationship between the data sequence and the timing deviation. Phase pre-emphasis improves the signal integrity with little additional power consumption in the transmitter and with no cross-talk penalty.

13 Claims, 3 Drawing Sheets

DATA-DEPENDENT JITTER PRE-EMPHASIS FOR HIGH-SPEED SERIAL LINK TRANSMITTERS

CROSS REFERENCE TO RELATED APPLICATIONS

This application is a continuation application of copending U.S. patent application Ser. No. 11/345,109 filed on Jan. 31, 2006, now abandoned, the contents of which are hereby fully incorporated by reference in its entirety.

FIELD OF THE INVENTION

The present invention relates generally to data equalization techniques for high speed serial links.

BACKGROUND OF THE INVENTION

High bandwidth chip-to-chip interconnection is a crucial part of many systems today. High speed inputs/outputs (I/Os) are extensively used in server processors, memory-central processing unit (CPU) interfaces, multiprocessor systems, and gaming applications. With increasing speed of on-chip data processing, there is an increasing demand for higher data rates. These high speed I/Os must also be capable of supporting low cost package and board technologies which introduce large signal degradation through bandwidth loss, reflection, and crosstalk.

Equalization of high-speed serial links has evolved to compensate inter-symbol interference (ISI) caused by frequency-dependent attenuation found in interconnects. Pre-emphasis-based equalization in the transmitter and decision feedback equalization in the receiver figure prominently in overcoming signal degradation and improving Bit Error Rate (BER). Currently, one challenge of equalization is minimizing power consumption while still improving signal integrity in the presence of attenuation and reflections.

Transmitters are a significant portion of the serial link power budget. The transmitter is required to drive enough power over lossy interconnects to meet minimum receiver sensitivity requirements. The use of amplitude pre-emphasis techniques, such as feed forward equalization, increases the power consumption and chip area and places additional demands on the dynamic range of the transmitter. Also, in a transmission system with high cross-talk between the channels, especially the near end cross talk where a transmitter is leaking into a neighboring receiver, amplitude pre-emphasis will enhance the high frequency cross-talk of the victim receiver which implies that its signal to noise ratio will be degraded.

In view of the foregoing, a growing need has been recognized in connection with improving upon the shortcomings and disadvantages presented by conventional arrangements.

SUMMARY OF THE INVENTION

In accordance with at least one presently preferred embodiment of the invention, there is broadly contemplated an expansion of the notion of pre-emphasis beyond conventional amplitude compensation of ISI, whereby phase pre-emphasis for compensating data-dependent jitter (DDJ) is introduced. DDJ can be addressed by exploiting the relationship between the data sequence and the timing deviation. Phase pre-emphasis improves the signal integrity with little additional power consumption in the transmitter and with no cross-talk penalty.

In summary, one aspect of the invention provides an apparatus for providing data dependent jitter in data transmission, the apparatus comprising: an input arrangement for accepting data input; an arrangement for detecting and decoding transitions in the data input; the arrangement for detecting and decoding being adapted to ascertain data transition history in the data input; and an arrangement for applying at least one delay to at least a portion of the data input, based on the ascertained data transition history.

Another aspect of the invention provides a method of providing data dependent jitter in data transmission, the method comprising the steps of: accepting data input; detecting and decoding transitions in the data input; the step of detecting and decoding comprising ascertaining data transition history in the data input; and applying at least one delay to at least a portion of the data input, based on the ascertained data transition history.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Generally speaking, in a link where losses due to signal attenuation are dominating other channel impairments such as reflection due to discontinuities, the amount of DDJ of a random bit sequence at the end of a link, which corresponds to timing deviation from ideal transition time, depends on the previous bit sequences only. Thus, the amount of DDJ at a given transition time corresponding to a given channel can be predicted by simply keeping track of the previous transitions. Also, it can be shown that the most recent transitions in previous data bits contribute to DDJ with larger amount. Thus, most of the DDJ can be predicted and compensated for by only detecting some of the most recent transitions. For typical links, one needs to detect down to the three previous data transitions to predict most of the DDJ occurring at a the current data transition.

Phase pre-emphasis manipulates the data transitions to neutralize DDJ at the end of the transmission channel. The delay of the data transition to be transmitted is dynamically changed depending on the previous bit sequence detected. In general, the highest frequency components of the data sequence are delayed before being transmitted in such a way that the arrival time of the different frequency components of the data sequence closely coincide at the end of the link. This delay (or phase) pre-distortion will thus increase both the timing and voltage margins of the signal at the end of the link.

In accordance with one preferred embodiment of the present invention, a full-rate clock transmitter architecture approach shows how a serial type phase pre-distortion is implemented. In accordance with a second preferred embodiment of the present invention, a quarter-clock transmitter architecture shows how a parallel type phase pre-distortion is implemented.

Figure 1:
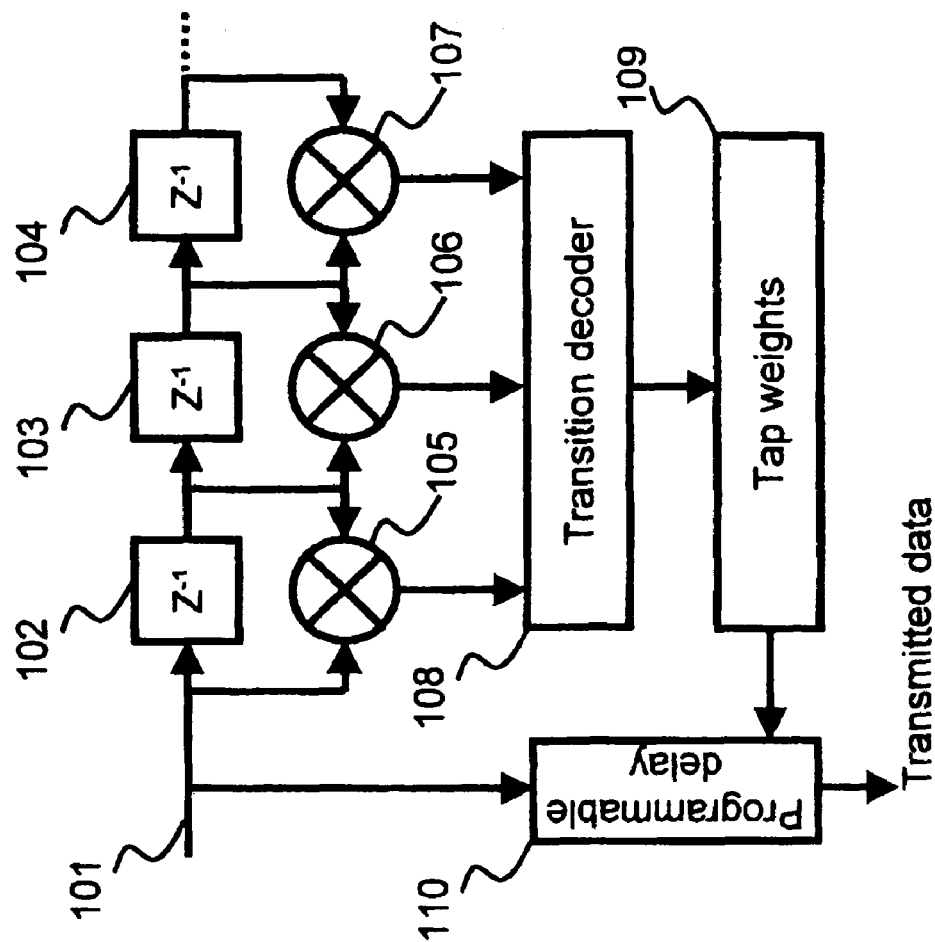
FIG. 1 is a block diagram of a first embodiment.

FIG. 1 illustrates the aforementioned first embodiment, corresponding to the front-end of a transmitter which performs phase pre-distortion on the serial data that is transmitted over the transmission medium possibly using a line driver. As shown, there are preferably provided single data bit time delay elements 102, 103 and 104, XOR gates 105, 106 and 107, a transition decoder 108 connected to outputs of XOR gates 105/106/107, programmable tap weights 109 and a programmable delay line 110.

Preferably, a serial data stream 101 is successively delayed by the single data bit delay elements 102, 103 and 104. Though only three delay elements are shown, the actual number of these delay elements can be as high as needed depending how many previous transitions need to be detected in order to compute the pre-distortion delay to be applied to the current bit. XOR gate 105 compares signal 101 to the output of 102 to detect if a transition is occurring on the current bit to be transmitted. If a transition is present the output of XOR gate 105 will be high. XOR gates 106, 107 function similarly to gate 105 but, respectively, compare signal outputs from delay elements 102/103 and from 103/104. As with gate 105, if a transition is detected then the output of gate 106 or 107 will be high, as appropriate. Then, depending on the data transition history that is determined by the transition decoder 108, a pre-distortion delay is added or subtracted to the current data transition time using the programmable delay line 110.

The amount of pre-distortion delay is programmed through the programmable tap weights 109 and depends on the transmission medium that needs to be equalized. Decoder 108 can be embodied and implemented in essentially any suitable manner. For instance, decoder 108 can employ simple Boolean logic to carry out its function as described above. At the same time, the amount of delay to be applied by delay line 110, once the data transition history is known, can depend on the channel at hand. As such, the delay could be pre-set or continuously optimized (if the transmitter can receive information about the channel from the receiving end of the link).

Figure 2:
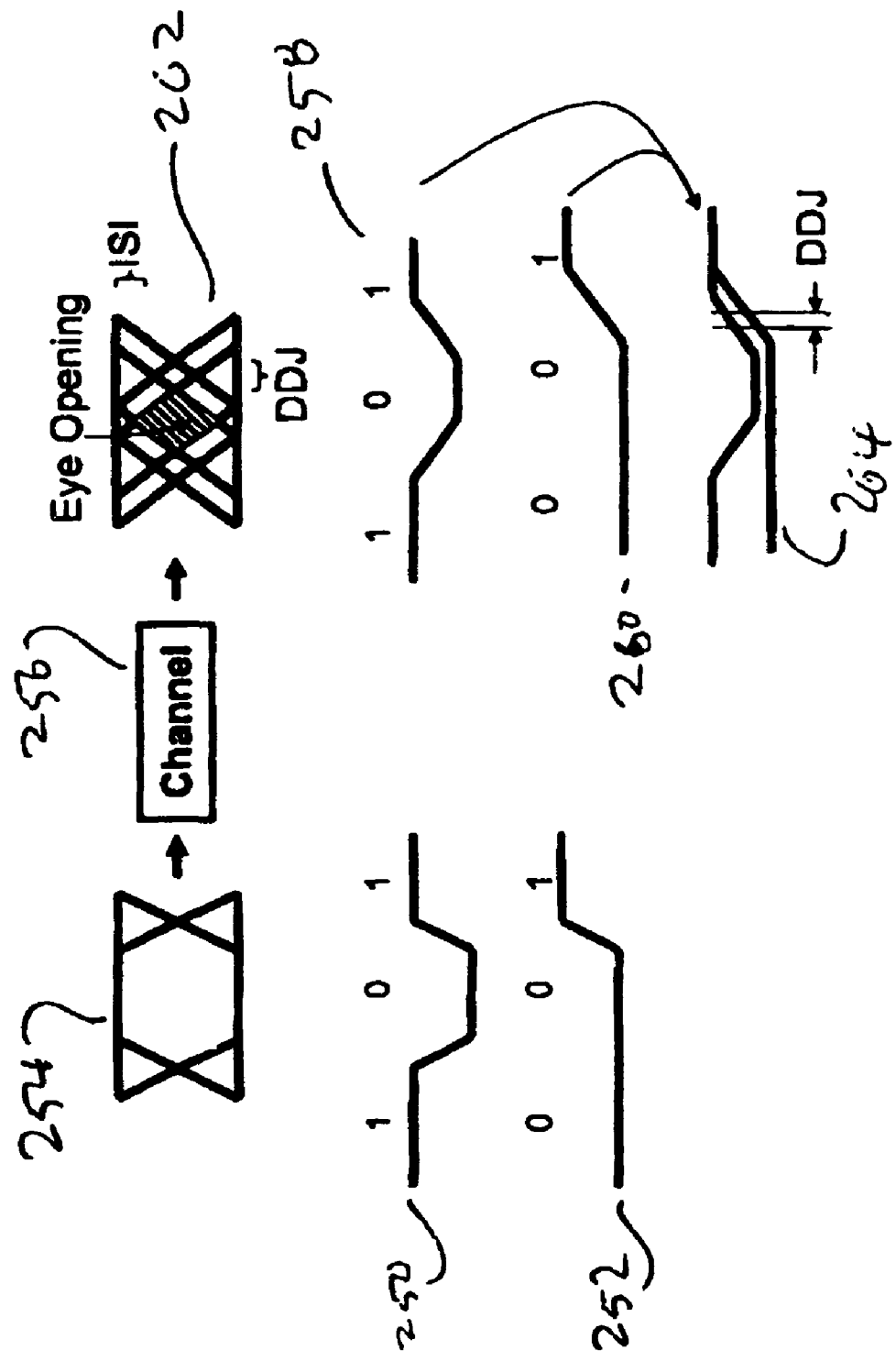
FIG. 2 is a schematic illustration of channel effect on data-dependent jitter.

For a typical transmission medium such as coaxial cable where the losses are dominated by frequency dependent attenuation, the high frequency components of a random data sequence arrive first at the end of the transmission medium, while the slowest ones arrives later, as illustrated in the left-hand portion of FIG. 2. Thus, in the illustrative and non-restrictive example shown, the higher-frequency component 250 arrives prior to component 252; the combined graph of these is indicated at 254. The aftereffect, if employed in accordance with the arrangement of FIG. 1, is shown in the right-hand portion of FIG. 2 upon exit from channel 256. Generally, the longest pre-distortion delay is added to the transmitted bit when the transition decoder 108 detects a transition on the previous bit, while the applied delay will be comparably shorter to the extent that the previous transition detected by the transition decoder 108 occurs with "earlier" bits. As shown, with "input" components 250 and 252 now transformed into "output" components 258 and 260, respectively, the former (258) has a comparatively greater delay applied, the result of which can be appreciated in the combined graph at 262 as well as the combined diagram at 264. The marked "DDJ" distance corresponds to this difference in delay. The "eye opening" is the region where data transitions are not present (when considering only DDJ and not jitter due to random noise); as such, data will be detected with no errors if sampled in this region.

Figure 3:
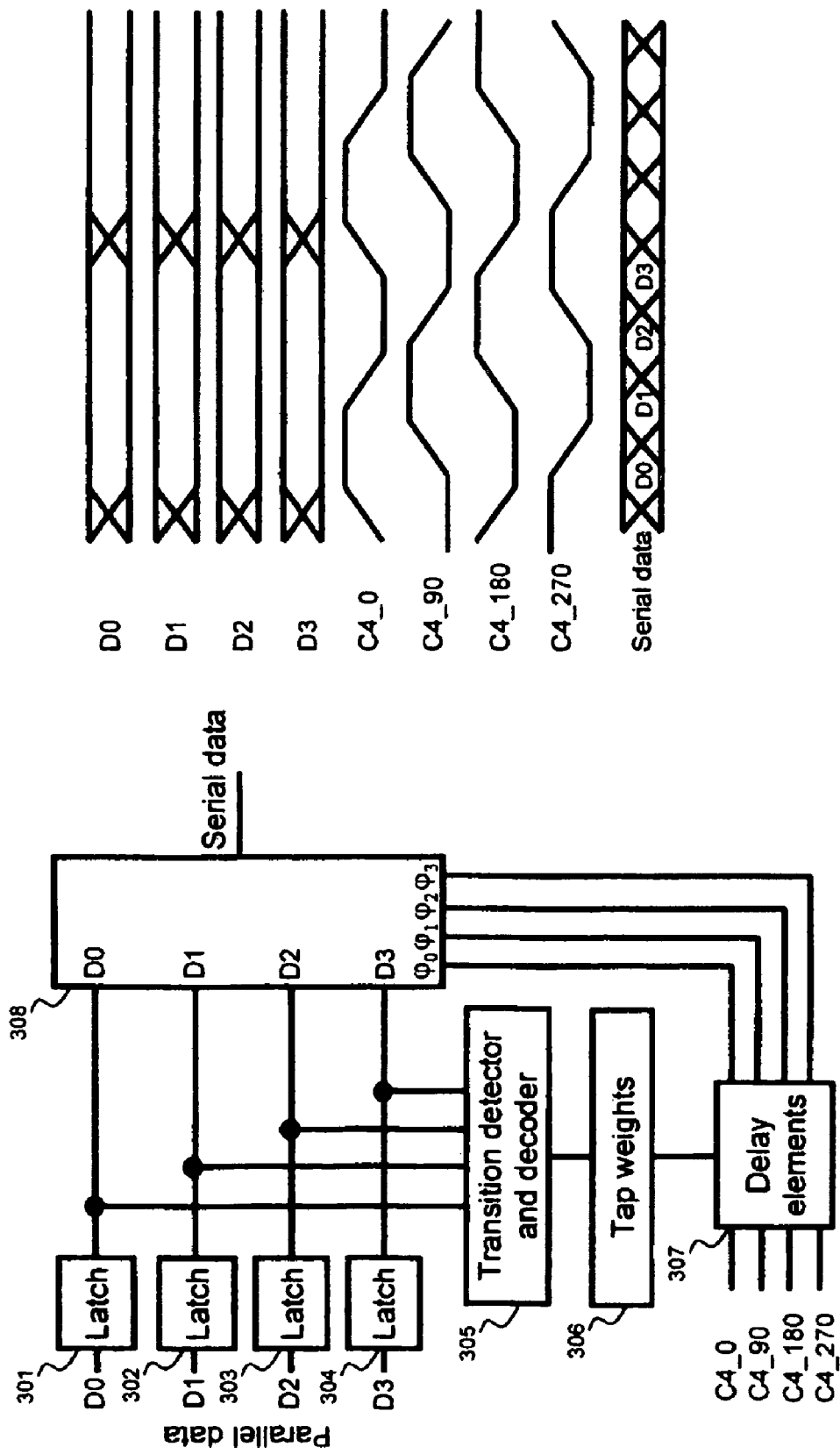
FIG. 3 is a block diagram of a second embodiment.

FIG. 3 illustrates a second preferred embodiment of the present invention, corresponding to a quarter-rate transmitter which performs phase pre-distortion on the serial data that is transmitted over a transmission medium (e.g., via a line driver), while using the quarter-rate data to detect the transition history. Included are data latches 301, 302, 303 and 304, a transition detector and decoder 305, programmable tap weights 306, programmable delay elements 307 and a quarter-rate 4:1 data multiplexer 308. Corresponding transmission graphs are illustrated to the right of the drawing. It should be clearly understood that while an illustrative and non-restrictive example of a quarter-rate implementation is shown in FIG. 3, the present invention, in accordance with at least one presently preferred embodiment, of course broadly embraces the implementation of essentially any workable arrangement involving parallel partial-rate data streams. Thus, for instance, the use of two half-rate data streams, as opposed to four quarter-rate streams, is conceivable in employing features discussed herein in connection with FIG. 3.

As shown, four parallel quarter-rate data streams D0, D1, D2 and D3 are received using sampling latches 301, 302, 303 and 304, respectively. These latches are not mandatory but are usually used to align the incoming parallel data to the local clock. As opposed to the first embodiment where the transition decoder was operating on serialized data, here the transition decoder 305 operates on the quarter-rate data stream to determine the data sequence to be transmitted through the channel. (It should be understood that this quarter rate example could be extended to even wider parallel data at the input that would be then time multiplexed before being transmitted.) Decoder 305 thereby generates a code that is then passed to the programmable delay elements 307 through the programmable tap weights 306 that will set the amount of phase pre-distortion on the data depending on the transmission medium used. To that end, the programmable delay elements 306 will pre-distort the phase of the four quarter-rate clocks C4_0, C4_90, C4_180 and C4_270 that are used to time multiplex the parallel quarter-rate data into a high speed serial data that is then transmitted through the transmission medium.

In recapitulation, there are broadly contemplated herein new equalization techniques involving phase pre-distortion as an alternative to conventional amplitude pre-emphasis. These techniques are in particular suitable for low power and low area serial link applications, especially when dealing with a lossy transmission medium that introduces excessive pattern dependent jitter. Phase pre-distortion is less power hungry than amplitude pre-emphasis and requires a smaller chip area. Also, phase pre-distortion does not degrade the signal to noise ratio due to the enhancement of channel cross talk at high frequency that is caused by amplitude pre-emphasis.

If not otherwise stated herein, it is to be assumed that all patents, patent applications, patent publications and other publications (including web-based publications) mentioned and cited herein are hereby fully incorporated by reference herein as if set forth in their entirely herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. An apparatus comprising:
   an input arrangement for accepting data input to be transmitted;
   an arrangement for detecting and decoding transitions in the data input;

said arrangement for detecting and decoding being adapted to ascertain data transition history in the data input; and
an arrangement for applying phase pre-distortion to at least a portion of the data input based on the ascertained data transition history;
wherein the phase pre-distortion neutralizes data dependent jitter of the data input;
wherein the input data comprises a serial data stream;
wherein said input arrangement further comprises a series of single data bit delay elements for successively delaying the serial data stream of the input data; and
wherein said detecting and decoding arrangement further comprises a plurality of XOR gates for comparing portions of the serial data stream at different sampling positions among said series of single data bit delay elements.

2. The apparatus according to claim 1, wherein said arrangement for applying phase pre-distortion is adapted to add or subtract a pre-distortion delay to the serial data stream of the input data.

3. The apparatus according to claim 1, wherein the input arrangement for accepting the data input further comprises a plurality of parallel partial-rate data streams.

4. The apparatus according to claim 3, wherein said input arrangement comprises a plurality of receiving elements for aligning the plurality of partial-rate data streams to a local clock.

5. The apparatus according to claim 3, wherein:
said detecting and decoding arrangement is adapted to influence the partial-rate data streams to determine a data sequence to be subsequently transmitted in an output serial data stream; and
said detecting and decoding arrangement is adapted to generate a code informing an amount of pre-phase distortion to be applied to the input data.

6. The apparatus according to claim 3, wherein said arrangement for applying phase pre-distortion is adapted to pre-distort the phase of a clock used in transitioning the partial-rate data streams into an output serial data stream.

7. The apparatus according to claim 3, wherein the data input comprises a plurality of parallel quarter-rate data streams.

8. A method comprising:
accepting data input to be transmitted;
detecting and decoding transitions in the data input;
said step of detecting and decoding comprising ascertaining data transition history in the data input; and
applying phase pre-distortion to at least a portion of the data input based on the ascertained data transition history;
wherein the pre-distortion neutralizes data dependent jitter of the data input;
wherein the data input comprises a serial data stream;
wherein said accepting step further comprises accepting via a series of single data bit delay elements configured for successively delaying the serial data stream of the input data; and
wherein said detecting and decoding step comprises comparing via a plurality of XOR gates portions of the serial data stream at different sampling positions among the series of single data bit delay elements.

9. The method according to claim 8, wherein said step of applying the phase pre-distortion further comprises adding or subtracting a pre-distortion delay to the serial data stream of the input data.

10. The method according to claim 8, wherein:
the data input comprises a plurality of parallel partial-rate data streams;
said step of applying phase pre-distortion further comprises pre-distorting the phase of a clock signal used in transitioning the plurality of parallel partial-rate data streams into an output serial data stream; and
the data input comprises a plurality of parallel quarter-rate data streams.

11. The method according to claim 10, wherein said input step comprises aligning the plurality of parallel partial-rate data streams to the local clock signal.

12. The method according to claim 10, wherein:
said detecting and decoding step comprises influencing the partial-rate data streams to determine a data sequence to be subsequently transmitted in an output serial data stream; and
said detecting and decoding step comprises generating a code informing an amount of pre-phase distortion to be applied to the input data.

13. A transmitter comprising:
an input arrangement that accepts data input to be transmitted;
an arrangement that detects and decodes transitions in the data input;
said arrangement that detects and decodes being configured to ascertain data transition history in the data input;
an arrangement that applies phase pre-distortion to at least a portion of the data input based on the ascertained data transition history; and
an arrangement for transmitting the phase pre-distorted data;
wherein the arrangement that applies the phase pre-distortion neutralizes data dependent jitter of the data input;
wherein said arrangement to ascertain the data transition history in the data input comprises predicting data dependent jitter occurring at a current data transition based on three previous data transitions.

* * * * *